United States Patent
Yu et al.

[11] Patent Number: 6,037,100
[45] Date of Patent: Mar. 14, 2000

[54] DRY FILM PHOTORESIST

[75] Inventors: Jae-Ok Yu; Hyoun-Souk Choi, both of Kimchun; Il-Young Jeong, Kumi; Byeong-Il Lee, Kumi; Kie-Jin Park, Kumi, all of Rep. of Korea

[73] Assignee: Kolon Industries, Inc., Kwachon, Rep. of Korea

[21] Appl. No.: 09/161,948

[22] Filed: Sep. 29, 1998

[30] Foreign Application Priority Data

Nov. 7, 1997 [KR] Rep. of Korea ............. 97-58770
Mar. 18, 1998 [KR] Rep. of Korea ............. 98-9290

[51] Int. Cl.[7] .................................. G03C 1/76
[52] U.S. Cl. ................................... 430/273.1
[58] Field of Search .......................... 430/273.1

[56] References Cited

U.S. PATENT DOCUMENTS

| | | | |
|---|---|---|---|
| 3,891,441 | 6/1975 | Tsuji et al. | 96/68 |
| 4,230,790 | 10/1980 | Hill . | |
| 4,339,527 | 7/1982 | Hill . | |
| 4,567,128 | 1/1986 | Bennett | 430/313 |
| 4,631,246 | 12/1986 | Bennett | 430/271 |
| 5,049,478 | 9/1991 | Koch et al. | 430/270 |
| 5,401,603 | 3/1995 | Bodager et al. | 430/158 |
| 5,648,159 | 7/1997 | Sato | 428/327 |
| 5,780,202 | 7/1998 | Nagahara et al. | 430/271.1 |
| 5,786,126 | 7/1998 | Nagahara et al. | 430/273.1 |

FOREIGN PATENT DOCUMENTS 04060642  2/1992  Japan .

OTHER PUBLICATIONS

L.R. Wallig, "Dry Film Photoresists", *The Multilayer Printed Circuit Board Handbook*, Chapter V.

*Primary Examiner*—Cynthia Hamilton
*Assistant Examiner*—Barbara Gilmore
*Attorney, Agent, or Firm*—Birch, Stewart, Kolasch & Birch, LLP

[57] ABSTRACT

The present invention relates to a dry film photoresist comprising the steps of:

preparing a photosensitive polymer prepared containing an acrylylic copolymer as a binder polymer, to which is added are a photopolymerizing monomer, photoinitiator, a photosensitive agent, color former, plasticizer and thermal stabilizer; drying the photosensitive polymer coated on a polyethylene terephthalate support in a predetermined thickness; and laminating a polyethylene terephthalate film with a certain surface property in a protective manner.

Since the dry film photoresist of this invention is used for the manufacture of a printed circuit boards and lead frames and employs a polyethylene terephthalate film having excellent surface properties, any problems such as air admixture generated from the process may be avoided, unlike prior technologies using polyethylene film as a cover film, thus reducing significantly the defect rate of a final product.

4 Claims, 2 Drawing Sheets

DRY FILM PHOTORESIST

BACKGROUND OF THE INVENTION

1. Field of the Invention

The present invention relates to a dry film photoresist and more particularly, to the dry film used for the manufacture of PCB (printed circuit board; hereinafter referred to as "PCB"), lead frame and BGA (ball grid array), comprising a polyethylene terephthalate film to satisfy some surface properties as a cover film, thus minimizing any defective fraction of a product requiring a higher resolution.

2. Discussion of Related Art

Since its development by Dupont of U.S.A. in the brand-name of "RISTON" in 1968, a dry film photoresist, i.e., a photosensitive film, has been employed as one of the vital elements in the electric/electronic field, particularly in the PCB processing.

Now that PCB's are widely applied as a basic part of the contact circuit in some household electronics, including industrial electronic equipments such as a computer and electrocommunication equipments, the film photoresist has been an epoch-making processing material involved in the manufacture of such industrial equipment.

About 50 percent of all photoresist materials designed for circuit formation on the PCB has been occupied by a photosensitive screen printing ink and liquid photoresist. While the film photoresist has been applied by necessity manufacturing the PCB with both-side plate and multi-layer plate requires a higher density and reliability.

The dry film photoresist consists of three layers, i.e., a base film, a photosensitive layer and a cover film.

In general, as far as a base film is concerned, a polyester film with the thickness of 16 $\mu$m, 19 $\mu$m, 25 $\mu$m derived from polyethylene terephthalate has been employed.

In the process of fabricating a dry film photoresist, a polyester base film is employed as a supporter, while a cover film serves to prevent a damage of resist by dusts and handling thereof.

Further, a photosensitive layer coated on a polyester film has the thickness ranging from 15 to 100 $\mu$m to adequately meet the purposes of use. The photosensitive layer has various compositions depending on the mechanical/ chemical characteristics of a film photoresist and processing conditions.

More specifically, the photosensitive layer comprises a) a multifunctional monomer whose photopolymerization is induced by light, b) a radical-inducing photoinitiator by light so as to bring about the photopolymerization, c) a binder polymer providing mechanical strength, tenting property and adhesiveness of a photopolymerization composition, and d) some additives such as dyes, stabilizers, adhesion promoter or thermal polymerization inhibitor. These materials, dissolved in an appropriate solvent, are coated on a polyester base film and then dried.

The photosensitive polymer may be used as a liquid phase itself, while the photosensitive layer consisting of photo-hardening components may be also used by lamination between a photo-permeating polyester film and cover film to secure a better workability and anti-contamination.

Referring to each component in more detail, the multifunctional monomer, photopolymerized by an initiator, shall have a resistance to a developing solvent during the post-process, while being removed by a stripping ingredient.

The commonly available multifunctional monomer include a compound having one or more $\alpha,\beta$-ethylenic unsaturated bonds. Further, according to the photopolymerization, a compound having two or more acryloyl groups or methacryloyl group in the molecule is preferred as a multifunctional monomer. Examples of such compound include glycol diacrylate derivatives such as ethylene glycol diacrylate, diethylene glycol diacrylate, triethylene glycol diacrylate, polyethylene glycol diacrylate, propylene glycol diacrylate, dipropylene glycol diacrylate, polypropylene glycol diacrylate, 1,4-butanediol diacrylate, 1,5-pentanediol diacrylate or 1,6-hexanediol diacrylate; additive material of ethylene or propylene oxide of Bisphenol A, such as N,N'-methylene bisacrylamide or N,N'-benzylidene bisacrylamide; and, some compounds having three or more acrylates such as glycerin triacrylate, trimethylol propane triacrylate, trimethylol ethane triacrylate, pentaerythriotol triacrylate, pentaerythritol tetracrylate, dipentaerythriotol hexacrylate, or methacrylate compounds threrof.

The photoinitiator, which functions to excite electrons by ultraviolet rays, plays a role to generate the radical or induce other compounds to generate the radical, thus contributing to the polymerization of multifunctional monomer. The photohardening rate of each component varies greatly depending on the types and contents of photoinitiator. Detailed examples of the photoinitiator include benzoin, benzoin methylether, benzoin ethylether, benzoin isopropylether or benzyl; alkylbenzophenone such as benzophenone, 4,4'-bis (diethylamino)benzopheone, chlorobenzophenone, 4,4'-dimethylaminobenzophenone or 4,4'-dichlorobenzophenone; anthraquinones such as 2-ethylanthraquinone or 2-t-butylanthraquinone; and, 4-(dialkylamino)benzoic acid alkylester or 2,4,5-triarylimidazle dimer and its derivatives or lobine dimer, or dyes such as leucotriphenylmethane, triarylmethane leuco-dye, or a composite containing a dye and lobine dimer.

Meantime, examples of the binder polymer include organic polymers such as acrylic polymers, styrene polymers, polyvinyl acetate, ethylene vinyl acetate, polyvinyl chloride, vinyl chloride-vinyl acetate copolymer, chlorinated polyethylene, chlorinated polypropyrene, vinylidene chloride polymers, polyester, polyamide, polyurethane, polyvinyl acetal, alkyd resin, phenol resin, epoxy resin, acetic acid cellulose, nitrificated cotton, styrene-butyrene copolymer, styrene-acrylonitrile copolymer, vinyl copolymer of chlorinated rubber or maleic anhydride, and aromatic sulfonamide formaldehyde resin.

Examples of the additives include dyes, stabilizers, adhesion promoters and thermal polymerization inhibitors.

Typical examples of leuco-dye include methyl, malachite green and crystal violet, while other dyes may be added depending on the purposes of use.

In general, a polyolefin film having the thickness ranging from 25 to 30 $\mu$m is employed as a cover film to fabricate the dry film photoresist; such polyolefin film, rolling the adhesive photosensitive layer to an axle without adhesion, plays an important role in the manufacture, transportation and storage of a film photoresist.

When a dry film photoresist with the above structure is to be employed, a stripped cover film is laminated on a copper-laminated plate, exposed by the ultraviolet rays and developed to form the image.

More specifically, a dry film photoresist composition is imbedded on the surface of a metal by coating or lamination and then, it is subject to exposure by ultraviolet rays. The desired image is formed in such a manner that the exposed area is hardened, while the unexposed area is removed with suitable solvents.

The solvents are largely classified into water-soluble and water-insoluble ones.

Since the water-insoluble solvents are blamed for adverse working conditions, environmental contamination and high production cost, use of photohardening compositions developed by water-soluble solvents have been on the gradual increase.

In the alkali-developing photosensitive resist, so prepared from the composition of a dry film photoresist, a cover film layer is removed from the dry film photoresist. Then, it is laminated in a copper plate and exposed by ultraviolet rays using a photomask film. The unexposed area is removed with an aqueous solution of alkali at the given concentration and temperature to form a desired photoresist pattern.

The term 'developing' refers to a process in which any unexposed area is removed using an aqueous solution of alkali to form a desired photoresist pattern. During the developing process, a photosensitive layer at the unexposed area is dissolved in an aqueous solution of sodium carbonate or potassium carbonate (0.5–1.5 wt. %) at the temperature ranging from 25 to 30° C., thus forming an image.

The fabricating method of the PCB is divided into a plating method and tenting method. According to the plating method, when a dry film photoresist is plated on a substrate by some plating solution and various additives, its anti-plating property is required so as not to be stripped by erosion. In contrast, the elasticity itself in the membrane of a dry film photoresist is required under the tenting method.

Meantime, the dry film photoresist functions as a hole-covering resist to protect from an etching solution some holes with certain size, serving to provide the conductivity to the upper and lower sides of a substrate.

Hence, the hole-covering dry film in a substrate shall have a sufficient elasticity so as to endure an outer stress under the developing conditions according to a spraying method of sodium carbonate or potassium carbonate in an aqueous solution (0.5–1.5 wt. %) at 25 to 35° C. and under the etching conditions according to a spraying method of $FeCl_2$, $FeCl_3$, $CuCl_2$, $CuCl_3$ and ammonia persulfate at 45 to 55° C.

However, the conventional alkali-developing photosensitive film as a cover film contains a polyolefin film such as polyethylene.

With some physical properties such as better flexibility, chemical-proofing and mold releasing, the polyethylene film may be easily removed, in case of using as a cover film of photosensitive resin composition. Further, since its friction coefficient on polyethylene terephthalate is large, little telescope (an original form of product is not maintained, while a foam comes out) does exist during the fabrication of a final product.

Nevertheless, during polymerization of polyethylene macromolecular gel is generated and after a film is formed, some micro-protuberances like fish eyes occur.

These fish eyes from the elongated polyethylene film may have a size of over 1 mm; some fish eyes having a size of over 0.3 mm are generated in the range from 500 to 50,000 particles/m², while numerous fish eyes having a size of less than 0.3 mm are generated.

When these fish eyes are radiated into a photosensitive layer for lamination, the air admixture is induced. In particular, when the thickness of a photoresist is thinner, the probability of product defect becomes higher.

FIG. 1 is a schematic view illustrating the air admixture generated by fish eyes.

In case where a polyethylene film 13 with a fish eye 20 is laminated on a copper laminated plate containing an epoxy resin 32 and a copper 31, which is radiated into the photosensitive layer 12, induces the air admixture at the side laminated with the copper plate.

The magnitude of air admixture will vary depending on the width and height of fish eye. Also, the thinner a photoresist in thickness is, the greater such magnitude of air admixture becomes.

In addition to the above factors, the air admixture may be generated by factors such as a poor substrate having holes, deep scratching trace, traces pressed by foreign materials present in a photoresist, and damages or scratch of laminator roll.

As shown in FIG. 1, the air admixture is not entirely involved in the product defects, and these defects may occur depending on certain circumstances. When the air-admixture area is located at the border of the non-exposed area, a circuit is reduced in the innerlayer process which may result in a circuit loss; in a plating process, the air admixture is responsible for expanding a circuit which may result in a short circuit.

SUMMARY OF THE INVENTION

Accordingly, this invention is directed to substantially obviating the defects in the manufacture of the PCB manufacture induced by the air admixture during dry film photoresist with polyolefin film, a cover film, having a poor surface property of the prior art, when the conventional dry film photoresist is prepared.

Therefore, an object of the present invention is to provide a dry film photoresist, derived from a polyethylene terephthalate film as a cover film having a better plenary surface property and less crude protuberance. The dry film photoresist of this invention may minimize the defective rate of product in the post-process such as the manufacture of the PCB requiring a high resolution, without any influence on the physical properties of resist.

To achieve the object of the invention, this invention is characterized in that a dry film photoresist prepared from a series of laminations using a cover film, a photosensitive layer and base film, wherein said cover film, which can meet the surface property of the dry film photoresist, is a biaxial drawing film derived from polyethylene terephthalate, represented by the following equation 1.

Equation 1.

$3.0$ nm $\leq SRa \leq 50$ nm, $50$ nm $\leq Spv \leq 500$ nm, $300$ particles $\leq$ Summit density $\leq 20,000$ particles Wherein, SRa represents a mean roughness of center line, when measured by a non-contact three-dimensional mean roughness measuring instrument; Spv is a difference of height from peak to valley; Summit density represents the number of protuberances having the height of over 1 nm rather than 4 points (1 point=2 $\mu$m×2 $\mu$m) per unit area.

BRIEF DESCRIPTION OF THE ATTACHED DRAWINGS

The accompanying drawings, which are included to provide a further understanding of the invention and are incorporated in and constitute a part of this specification, illustrate embodiments of the inventions, and together with the description serve to explain the principles of the invention.

Figure 1:
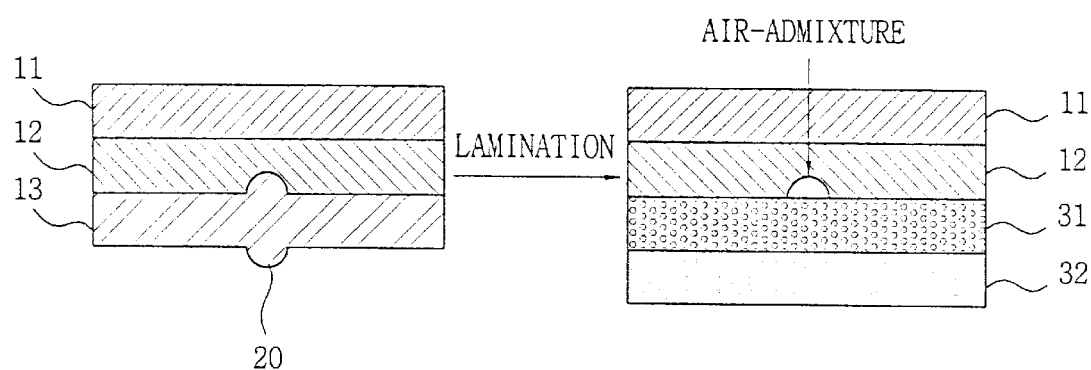
FIG. 1 is a schematic view of air admixture generated when a dry film photoresist derived from a common available polyethylene film as a cover film is laminated with a copper laminated plate.

<Detailed explanation of main reference numbers in the drawings>

11—Polyethylene terephthalate film 12—Photosensitive layer
13—Polyethylene film 20—Fish eye
31, 41, 51—Copper 32—Epoxy resin

DETAILED DESCRIPTION OF PREFERRED EMBODIMENT

This invention is explained in more detail as set forth hereunder.

Since the dry film photoresist of this invention derived from a polyethylene terephthalte film as a cover film, has a better surface property and less crude protuberances, the biaxial drawing film of polyethylene terephthalate shall have a better surface property as aforementioned.

If such surface property is duly met, it was ascertained that better surface property significantly reduced the defect rate associated with fish eyes on a protective film with less influence by dusts.

It is more preferred that to meet the surface property of the dry film photoresist, a polyethylene terephalate film, represented by the following equation 2, is employed.

Equation 2.

$5.05 nm \leq SRa \leq 25 nm$, $100 nm \leq Spv \leq 250 nm$, $500 \leq$ Summit density $\leq 10,000$ Wherein, SRa, Spv and summit density are the same as defined above.

From the above equation, if the values of SRa, Spv and summit density are larger, crude particles may potentially increase and with increased adhesive force between a photosensitive composition and a cover film, a terephthalate film may be torn down during the removal of a cover film. In contrast, if the above level is lower, radical increase in the friction coefficient may lead to some defects such as scratch, static electricity and other manufacturing problems in manufacturing some films and dry film photoresist.

However, if a chemical treated polyester film for adhesion promotion is employed as a cover film, the reduced adhesive force between a cover film and photosensitive layer may make it possible to remove the cover film in a stable manner.

In case where the polyethylene terephthalate is employed as a cover film, its friction coefficient, which is lower than the conventional polyethylene cover film, may raise a telescope but as a result of evaluating a final product by slitting, a product with no defect has been obtained.

According to this invention, it is preferred that the thickness of the polyethylene terephalate film is in the range of 12 to 25 mm.

If the thickness of the polyethylene terephthalate film exceeds 25 mm, the poor unweaving property due to its strong recovery power may raise a slip (a phenomenon that a product is scattered, when a photosensitive layer is unweaved). In contrast, if the thickness of the polyethylene terephthalate is less than 12 mm, an edge fusion may be disadvantageous.

The formulating method of the dry film photoresist, derived from polyethylene terephthalate having a certain surface property as a cover film layer, is based on the common method. Hence, there is no limit in the construction of a supporter and a photosensitive layer.

This invention is explained in more detail based on the following examples but is not limited by these examples.

Manufacturing example 1: Chemical composition of a photosensitive layer

The chemical composition of a photosensitive layer comprising a dry film photoresist is shown in the following table 1.

The acrylic copolymer prepared from the mixture containing acrylic acid (10 w %), methacrylic acid (15 wt. %), methylmethacrylate (60 wt. %) and 2-ethylhexylacrylate (15 wt. %), was employed as a binder polymer. However, since such equation is nothing but a method designed to help understand this invention, this invention is not limited by such method.

Unless the object of this invention is deviated, other different acrylic copolymers, so prepared by selecting from the following group, may be used except for the acrylic monomer as aforementioned: alkylacrylate such as methylacrylate, ethylacrylate or propylacrylate; alkylmethacrylate such as ethylmethacrylate or propylmethacrylate; styrene and its derivatives; phenoxymethylacrylate, 2-phenoxyethylacrylate, maleic acid, maleic anhydride or vinylacetate.

Some photoinitiator, photopolymeric monomer and other additives may be freely used, unless the object of this invention is deviated.

TABLE 1

| Photohardening resin composition | | Content (w %) |
|---|---|---|
| Binder polymer | | 50.0 |
| Photoinitiat | Benzophenone | 2.0 |
| or | 4,4-bis(diethylamino)benzophenone | 1.0 |
| | Leucocrystal violet | 3.0 |
| | Toluene sulfonic acid monohydrate | 0.5 |
| | Diamond green GH | 0.5 |
| Photopolymer | 9G | 10 |
| ic | APG-400 | 10 |
| monomer | BPE-500 | 10 |
| Solvent | Methylethyl ketone | 13.0 |

EXAMPLES 1~3

A dry film photoresist was prepared in such a manner that the photosensitive composition, so prepared from manufacturing example 1, was coated on a polyester cover film by 20 mm in thickness and further, laminated with a cover film having the surface roughness as indicated in the following table 2. Hence, a chemical treated film for adhesive promotion in Example 3 was employed.

COMPARATIVE EXAMPLES 1~2

In the same procedure as described in the Examples, a dry film photoresist was prepared; a polyethylene film (Tamapoly Co.) in Comparative example 1 was employed as a cover film, while a polyethylene terephthalate (PET) film for general package in Comparative examples 2~3 was employed. The assessment was conducted in the same manner as in Example.

TABLE 2

|  | | Thickness (mm) | SRa (nm) | Spv (nm) | Summit density (mm$^2$) | Slipness[1] | Remarks |
|---|---|---|---|---|---|---|---|
| Example | 1 | 15 | 15 | 180 | 5500 | ○ | |
| | 2 | 15 | 11 | 130 | 6000 | ○ | |
| | 3 | 21 | 18 | 220 | 9000 | ○ | chemical treated for adhesive promotion |
| Comparative example | 1 | 23 | \multicolumn{3}{Polyethylene film} | ◎ | Tamapoly co. |
| | 2 | 23 | 30 | 550 | 25,000 | Δ | |
| | 3 | 38 | 87 | 1,300 | 75,000 | X | |

Note:
[1]◎: extremely good, ○: good, Δ: fair, X: bad

Each dry film photoresist, so prepared from Examples 1~3 and Comparative examples 1~2, was imbedded on a copper laminated plate based on the fraction defective analysis so as to evaluate any open circuit and side etching.

Figure 2:
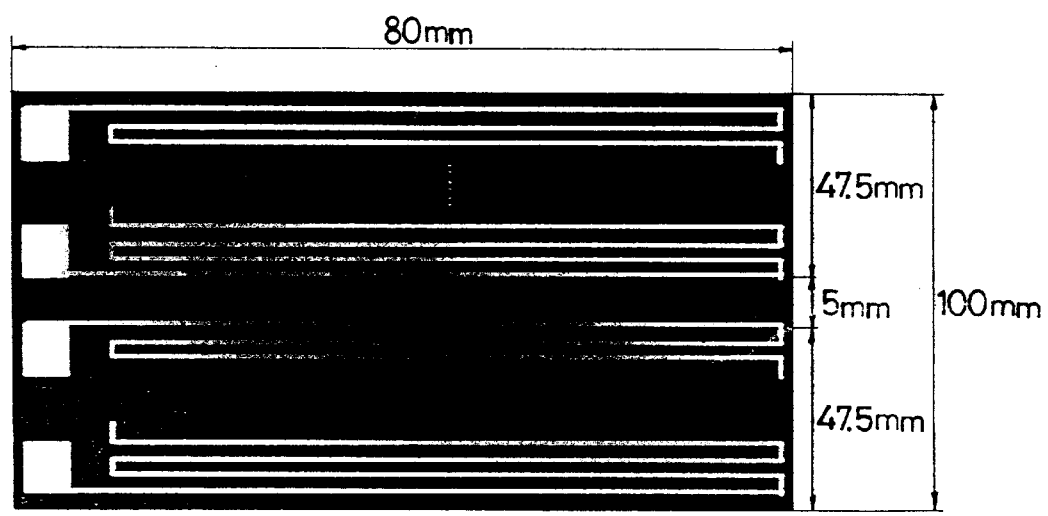
FIG. 2 is a photomask used for the evaluation of fraction defective generated from a cover film of the dry film photoresist, being prepared from Examples and Comparative examples.

More specifically, a photomask (40 cm×50 cm) having 25 unit circuits was prepared so as to assess some defects induced by a cover film, as shown in FIG. 2.

Referring to FIG. 2, the width of white line was 150 μm, while width between white lines was 50 μm.

After the same procedure was established prior to lamination, 10 sheets of each copper laminated plate (40 cm×50 cm substrate) per sample containing changed cover films were laminated and exposed by a photomask (40 cm×50 cm) having 25 unit circuits, as shown in FIG. 2. The exposed substrate was developed at the break point of 50% and etched at the break point of 80% break point in the presence of etchant containing copper chloride. As revealed in FIGS. 3 to 4, a total number of open circuits and side etching was measured.

Hence, the measurement and assessment standards are as follows:

Lamination

The dry film photoresist, so prepared from the photosensitive composition according to the Examples and Comparative examples, was laminated by Dynachem 360 at one side of a copper laminated plate of 1.6 mm in thickness, being treated by blush abrasiveness under the following conditions of laminator: roll temperature (110° C.), roll pressure (3.0 kg/cm$^2$) and roll rate (2.5 min/m)

Exposure

HTE-106 (5 Kw, HI-TECH Co., Ltd.) was employed as an exposuer. Each sample were laminated at a copper laminated plate (40 cm×50 cm) and exposed by a photomask (40 cm×50 cm) having 25 unit circuits at exposed radiation of 30 mJ/cm$^2$ [energy amount of radiation measured under photomask using UV-350 actinometer (ORC Manufacturing Co., Ltd.)], as shown in FIG. 2.

Minimum developing time

The dry film photoresist was laminated as a copper laminated plate and left for 20 minutes. The dry film photoresist was developed at 30° C. by a sodium carbonate aqueous solution (1.0 w %) by a spraying method. Hence, the time when the unexposed parts of the dry film photoresist laminated at a copper laminated plate was completely washed by a developer was measured by a microchronometer.

Etching and stripping

The exposed substrate was left for 20 minutes, developed at the break point of 50% versus a minimum developing time and etched at the break point of 80% in the presence of an etchant containing copper chloride. The etched substrate was stripped in the presence of NaOH solution (3.0 wt. %) at 50° C. at the break point of 60%.

Figures 3, 4:
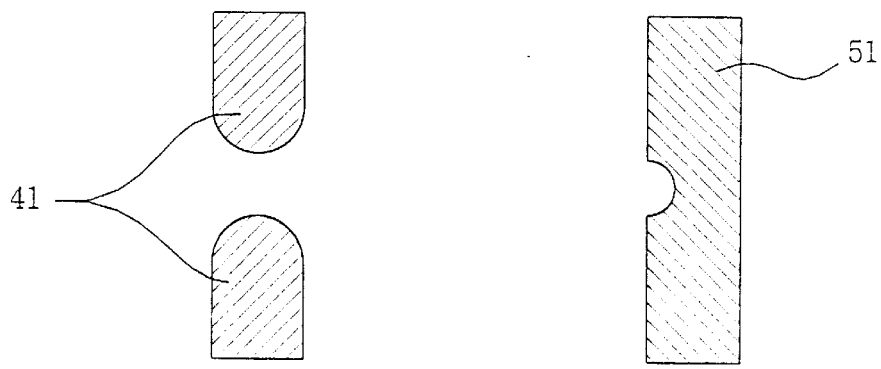
FIG. 3 is a conceptual view of an open circuit, when the fraction defective of a dry film photoresist prepared from Examples and Comparative examples is evaluated.
FIG. 4 is a conceptual view of a side etching, when the fraction defective of a dry film photoresist prepared from Examples and Comparative examples is evaluated.

Fraction defective analysis 10 sheets of each copper laminated plate (40 cm×50 cm) per sample, so prepared, were subject to a series of processes such as "surface preparation-lamination-exposure-developing-etching-stripping" in the presence of a photomask for the fraction defective analysis as revealed in FIG. 3 and 4, a total number of open circuits and side etching detected from the substrate was measured.

Slipping property

The photosensitive composition, being coated on a base film and imbedded with a cover film, was slipped in the width of 400 mm. While laminating the substrate on a laminator, the original shape of desired product was observed by naked eyes.

TABLE 3

| | | Average defect (particle/ 0.20 mm$^2$) | | |
|---|---|---|---|---|
| | | open circuit | Side etching | Slipping property[1] |
| Example | 1 | 0.1 | 0.3 | ○ |
| | 2 | 0.1 | 0.4 | ○ |
| | 3 | 0.2 | 0.6 | ○ |
| Comparative example | 1 | 3.0 | 15.0 | ◎ |
| | 2 | 1.0 | 4.0 | Δ |
| | 3 | 2.0 | 7.0 | X |

Note:
[1]◎:: extremely good, ○: good, Δ: fair, X: bad

From the results of the table 3, it was understood that if the polyethylene terephthalate film having a better surface property and less crude protuberances was employed as a cover film, defective rates of product associated with an open circuit or side etching was insignificant. In contrast, as shown in the prior art, if a polyethylene film or polyethylene terephthalate film with poor surface property was employed, the defect rate of product associated with an open circuit or side etching was significant, let alone a reduced slipping property.

As described above in more detail, the dry film photoresist of this invention, so prepared from the lamination of polyethylene terephthalate film as a cover film, has several advantages in that a) with better surface property, the polyethylene terephthalate film can prevent any fish eyes generated from a polyethylene film of the prior art as a cover film, and b) when the dry film photoresist applies to the PCB, lead frame and BGA (ball grid array), less air admixture may lead to significant reduction of defective rate in a final product.

What is claimed is:

1. A dry film photoresist prepared from a series of lamination in the order of a cover film, a photosensitive layer and base film, wherein said cover film, which can meet the surface property of the dry film photoresist, is a polyethylene terephthalate biaxial drawing film, represented by the following equation 1:

$3.0 \text{ nm} \leq SRa \leq 50 \text{ nm}$, $50 \text{ nm} \leq Spv \leq 500 \text{ nm}$, $300 \text{ particles} \leq \text{Summit density} \leq 20{,}000 \text{ particles}$ where, SRa represents a mean roughness of center line, when measured by a non-contact three-dimensional mean roughness measuring instrument; Spv is a difference of height from peak to valley; Summit density represents the number of protuberances having the height of over 1 nm rather than 4 points (1 point=2 $\mu$m×2 $\mu$m) per unit area.

2. The dry film photoresist of claim 1, wherein said polyethylene terephthalate film, which can meet the surface property of the dry film photoresist, is a biaxial drawing film represented by the following equation 2:

$5.0 \text{ nm} \leq SRa \leq 30 \text{ nm}$, $100 \text{ nm} \leq Spv \leq 250 \text{ nm}$, $500 \text{ particles} \leq \text{Summit density} \leq 10{,}000 \text{ particles}$ where, SRa, Spv and summit density are the same as defined above.

3. The dry film photoresist of claim 1, wherein the thickness of said polyethylene terephthalate film ranges from 12 to 25 $\mu$m.

4. The dry film photoresist of claim 1, wherein said polyethylene terephthalate film is a chemical treated product for adhesive promotion.

* * * * *